(12) United States Patent
Hsu et al.

(10) Patent No.: US 11,561,145 B2
(45) Date of Patent: Jan. 24, 2023

(54) SENSOR MEMBRANE STRUCTURE WITH INSULATING LAYER

(71) Applicant: Nuvoton Technology Corporation, Hsinchu (TW)

(72) Inventors: Chung-Lung Hsu, Hsinchu (TW); Kuang-Chu Chen, Hsinchu (TW); Peng-Chan Hsiao, Taoyuan (TW); Han-Ying Liu, Hsinchu (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 131 days.

(21) Appl. No.: 17/061,216

(22) Filed: Oct. 1, 2020

(65) Prior Publication Data
US 2021/0199524 A1 Jul. 1, 2021

(30) Foreign Application Priority Data
Dec. 27, 2019 (TW) .................................. 108148011

(51) Int. Cl.
*G01L 7/08* (2006.01)
*G01L 9/00* (2006.01)
*B81B 7/02* (2006.01)

(52) U.S. Cl.
CPC ............ *G01L 7/082* (2013.01); *G01L 9/0072* (2013.01); *B81B 7/02* (2013.01); *B81B 2201/0264* (2013.01)

(58) Field of Classification Search
None
See application file for complete search history.

(56) References Cited

U.S. PATENT DOCUMENTS

2017/0343439 A1* 11/2017 Tham ..................... G01L 9/0051
2018/0306659 A1* 10/2018 Wade .................. G01L 19/0654

FOREIGN PATENT DOCUMENTS

| CN | 204085748 U | 1/2015 |
| CN | 205449349 U | 8/2016 |

OTHER PUBLICATIONS

Office Action and Search Report of the corresponding TW patent application No. 108148011 dated Apr. 27, 2020.

* cited by examiner

*Primary Examiner* — Lisa M Caputo
*Assistant Examiner* — Nigel H Plumb
(74) *Attorney, Agent, or Firm* — Muncy, Geissler, Olds & Lowe, P.C.

(57) ABSTRACT

A sensor membrane structure is provided. The sensor membrane structure includes a substrate, a first insulating layer, and a device layer. The substrate has a first surface and a second surface that is opposite to the first surface. A cavity is formed on the first surface, an opening is formed on the second surface, and the cavity communicates with the opening. The cavity and the opening penetrate the substrate in a direction that is perpendicular to the first surface. The first insulating layer is disposed on the first surface of the substrate. The device layer is disposed on the first insulating layer. The first insulating layer is disposed for protecting the sensor membrane structure from overetched and remain stable during the etching process, increasing the yield of the sensor membrane structure.

11 Claims, 8 Drawing Sheets

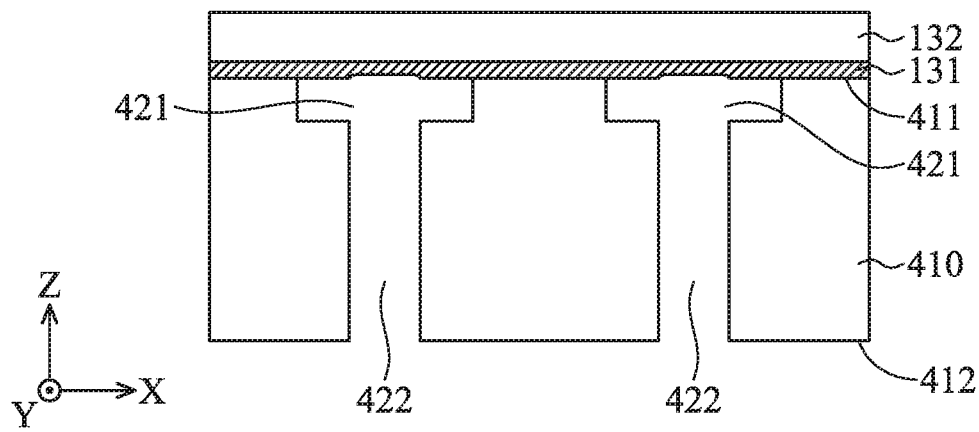
FIG. 9
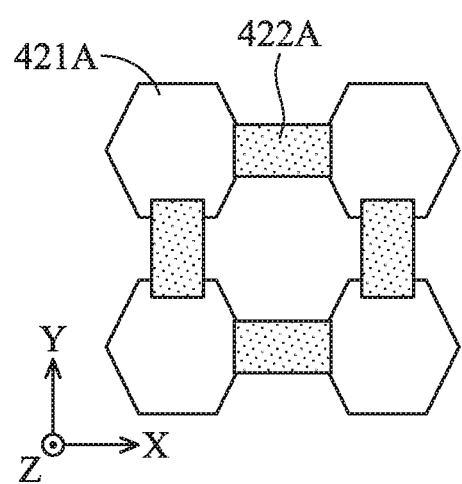 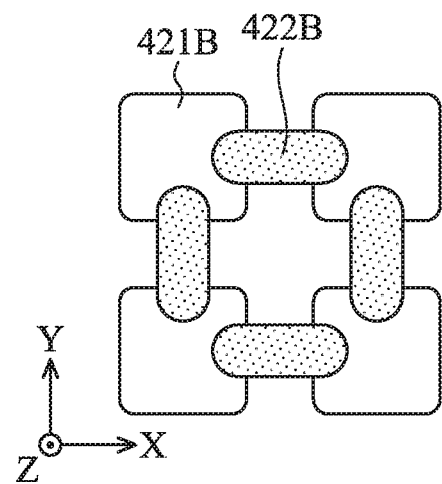
FIG. 10A  FIG. 10B ically to the first surface. The first insulating layer is disposed on the first surface of the substrate. The device layer is disposed on the first insulating layer.
SENSOR MEMBRANE STRUCTURE WITH INSULATING LAYER

CROSS REFERENCE TO RELATED APPLICATIONS

This application claims priority of Taiwan Patent Application No. 108148011, filed Dec. 27, 2019, the entirety of which is incorporated by reference herein.

BACKGROUND

Field of the Invention

The present invention relates to a sensor membrane structure and a method for forming the same, and in particular to a sensor membrane structure with a backside opening and a method for forming the same.

Description of the Related Art

Existing pressure sensors detect changes in current, voltage, resistance and/or capacitance after applying pressure and calculating a value for the pressure. In response to the trend in miniaturization of electronic devices, the size of pressure sensors has become smaller and smaller. Currently, a microelectromechanical systems (MEMS) technique may be used to manufacture pressure sensors with small sizes. However, improving the yield and quality of small pressure sensors is still an important topic.

BRIEF SUMMARY

Some embodiments of the disclosure provide a sensor membrane structure including: a substrate, a first insulating layer and a device layer. The substrate has a first surface and a second surface that is opposite to the first surface. A cavity is formed on the first surface, an opening is formed on the second surface, and the cavity communicates with the opening. The cavity and the opening penetrate the substrate in a direction that is perpendicular to the first surface. The first insulating layer is disposed on the first surface of the substrate. The device layer is disposed on the first insulating layer.

Some embodiments of the disclosure provide a method for forming a sensor membrane structure, including: providing a substrate with a cavity; providing a device and bonding the device on the substrate; and etching the substrate to form an opening that communicates with the cavity.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein:

FIG. 9 is a cross-sectional view illustrating the sensor membrane structure in accordance with some embodiments of the present disclosure.

FIG. 10A to 10B are top views illustrating the cavities and the openings in accordance with some embodiments of the present disclosure.

DETAILED DESCRIPTION OF THE INVENTION

The sensor membrane structures and methods for forming the same of some embodiments of the present disclosure are described in the following description. The specific embodiments disclosed are provided merely to clearly describe the usage of the present disclosure by some specific methods without limiting the scope of the present disclosure.

In addition, in this specification, relative expressions may be used. For example, "lower", "bottom", "higher" or "top" are used to describe the position of one element relative to another. It should be noted that if a device is flipped upside down, an element that is "lower" will become an element that is "higher".

It should be understood that, although the terms "first", "second," "third" etc. may be used herein to describe various elements, regions, layers and/or portions, and these elements, regions, layers, and/or portions should not be limited by these terms. These terms are only used to distinguish one element, component, region, layer, or portion. Thus, a first element, component, region, layer or portion discussed below could be termed a second element, component, region, layer or portion without departing from the teachings of some embodiments of the present disclosure. In addition, for the sake of clarity, the terms "first", "second," "third" etc. may not be used in the specification to distinguish different elements. The first element, the second element and/or the third element recited in the claims may be referred to any element that conforms to the description in the specification.

Unless defined otherwise, all terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure. In addition, the terms "substantially," "approximately," or "about" are recited in the present disclosure and are intended to encompass the circumstances or ranges that are substantially or exactly the same. It is noted that even if the above terms are not recited in the description, it should be read as the same meaning as these terms are recited.

Figure 1A:
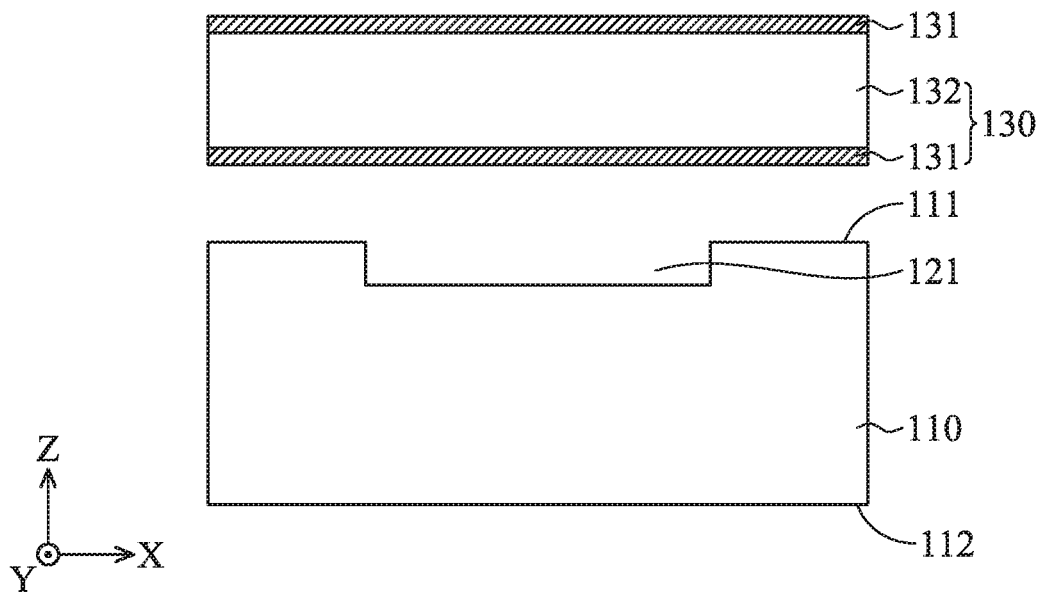
FIG. 1A to 1D are cross-sectional views illustrating a manufacturing process of a sensor membrane structure in accordance with some embodiments of the present disclosure.

FIG. 1A to 1D are cross-sectional views illustrating a manufacturing process of a sensor membrane structure 100 in accordance with some embodiments of the present disclosure. As shown in FIG. 1A, a substrate 110 is provided, wherein the substrate 110 has a first surface 111 and a second surface 112 that is opposite to the first surface 111. In some embodiments, the material of the substrate 110 includes silicon (Si). For example, the first surface 111 is the top surface of the substrate 110, and the second surface 112 is the bottom surface of the substrate 110, but the present disclosure is not limited thereto. A cavity 121 is formed on the first surface 111. In addition, a device 130 is provided, wherein the device has a device layer 132 which is located between two first insulating layers 131. In some embodiments, the material of the device layer 132 includes silicon (Si), and the material of the first insulating layers 131 includes silicon oxide or any other suitable insulating material.

Figure 1B:
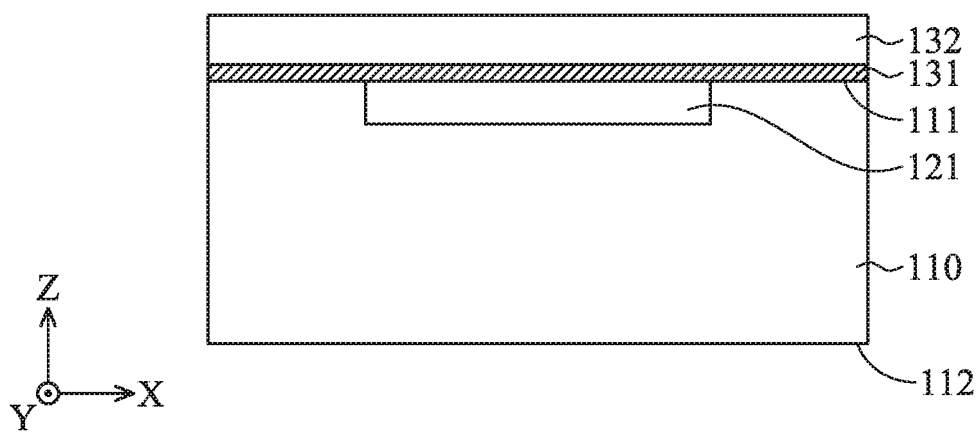
Figure 1C:
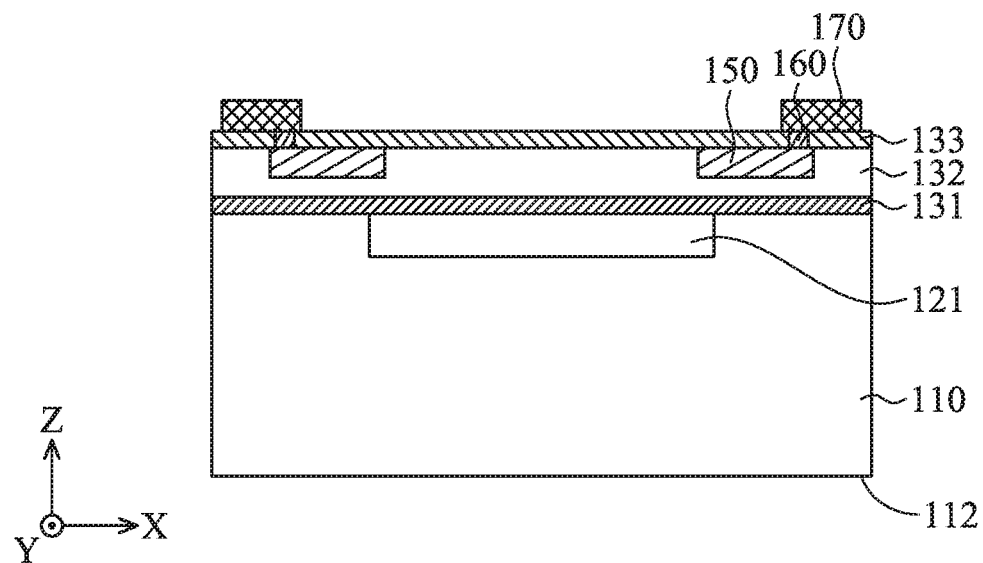

Then, as shown in FIG. 1B, the device 130 is bonded to the substrate 110, so that the first insulating layer 131 is located over the first surface 111 of the substrate 110 and covers the cavity 121. A polishing process is performed to the device 130, removing a portion, that does not abut the substrate 110, of the first insulating layer 131 and a portion of the device layer 132. As shown in FIG. 1C, an electronic component 150 is disposed in the device layer 132, wherein the electronic component 150 and the cavity 121 at least partially overlap in a direction (the Z-axis) that is perpendicular to the first surface 111. In other words, the electronic component 150 is at least partially located directly above the cavity 121. In some embodiments, the electronic component 150 may be completely located in a region of the cavity 121. For example, the electronic component 150 may be a resistor, an inductor, a capacitor or any other electronic component that may serve as a sensor. A second insulating layer 133 is formed on the device layer 132 and the electronic component 150. The material of the second insulating layer 133 may be the same as or different from the material of the first insulating layer 131.

A via hole 160 may be formed in the second insulating layer 133 in order to electrically connect the electronic component 150 and the external component. In some embodiments, the via hole 160 and the cavity 121 do not overlap in the direction (the Z-axis) that is perpendicular to the first surface 111. A conductive element 170 is disposed on the second insulating layer 133 and is electrically connected to the electronic component 150 via the via hole 160. Therefore, electric signals may be transmitted to the electronic component 150. Since the conductive path is designed as above, the electronic component 150, the via hole 160 and the conductive element 170 may overlap in the direction (the Z-axis) that is perpendicular to the first surface 111.

Figure 1D:
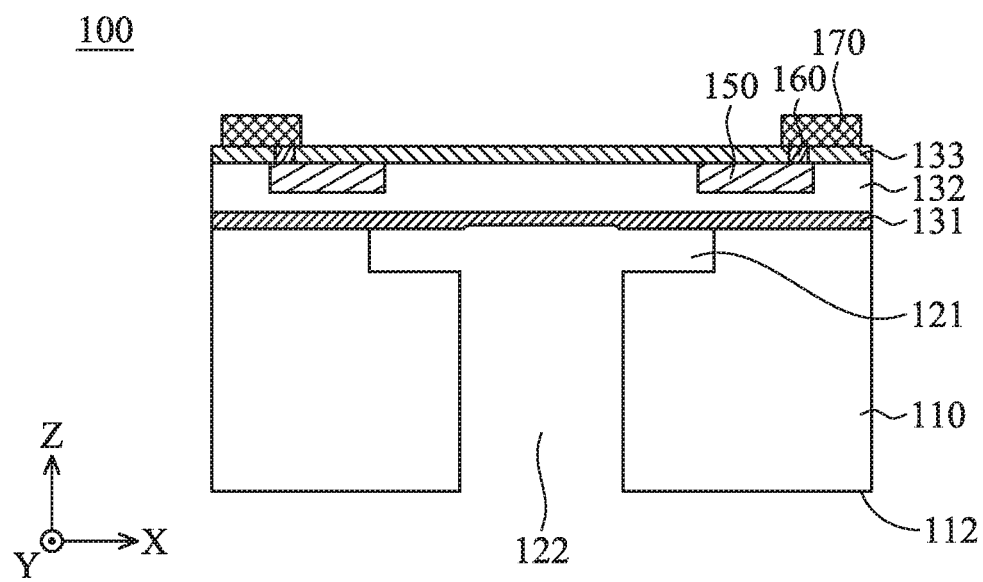

As shown in FIG. 1D, an etching process is performed to the second surface 112 of the substrate 110 to form an opening 122 that communicates with the cavity 121 on the second surface 112. In the present embodiments, for the sake of simplicity, the substrate 110 is illustrated as a single-layered structure. In some embodiments, the substrate 110 may be a multi-layered structure.

In some embodiments, when viewed in the direction (the Z-axis) that is perpendicular to the first surface 111, the opening 122 and the cavity 121 overlap. Accordingly, the cavity 121 and the opening 122 may penetrate the substrate 110. The width of the cavity 121 is greater than the width of the opening in a direction (the X-axis or the Y-axis) that is parallel to the first surface 111. In some embodiments, the first insulating layer 131 and the opening 122 at least partially overlap in the direction (the Z-axis) that is perpendicular to the first surface. In some embodiments, the thickness of the portion (corresponding to the opening 122) of the first insulating layer 131 is shorter than the thickness of the other portion (non-corresponding to the opening 122) of the first insulating layer 131. More specifically, due to the arrangement of the cavity 121, a portion of the first insulating layer 131 may be etched when performing the etching process to form the opening 122. The first insulating layer 131 serves as an etch stop layer for the above etching process. In the present embodiment, the device layer 132 and the cavity 121 are separated by first insulating layer 131. That is, the device layer 132 is not exposed from the cavity 121 and the opening 122, but the present disclosure is not limited thereto.

In should be noted that the cavity 121 may communicate with the external environment via the opening 122, and therefore the pressure in the cavity 121 and the opening 122 is substantially the same as the external pressure (such as the atmospheric pressure). When the change of relative pressure is detected, the device layer 132 may deform, such that the electronic component 150 disposed in the device layer 132 is affected. As a result, the electronic component 150 may detect different target values (such as current value, voltage value and/or resistance value), and the relative pressure value may be calculated by the difference between the detected value and the normal value.

Figure 2:
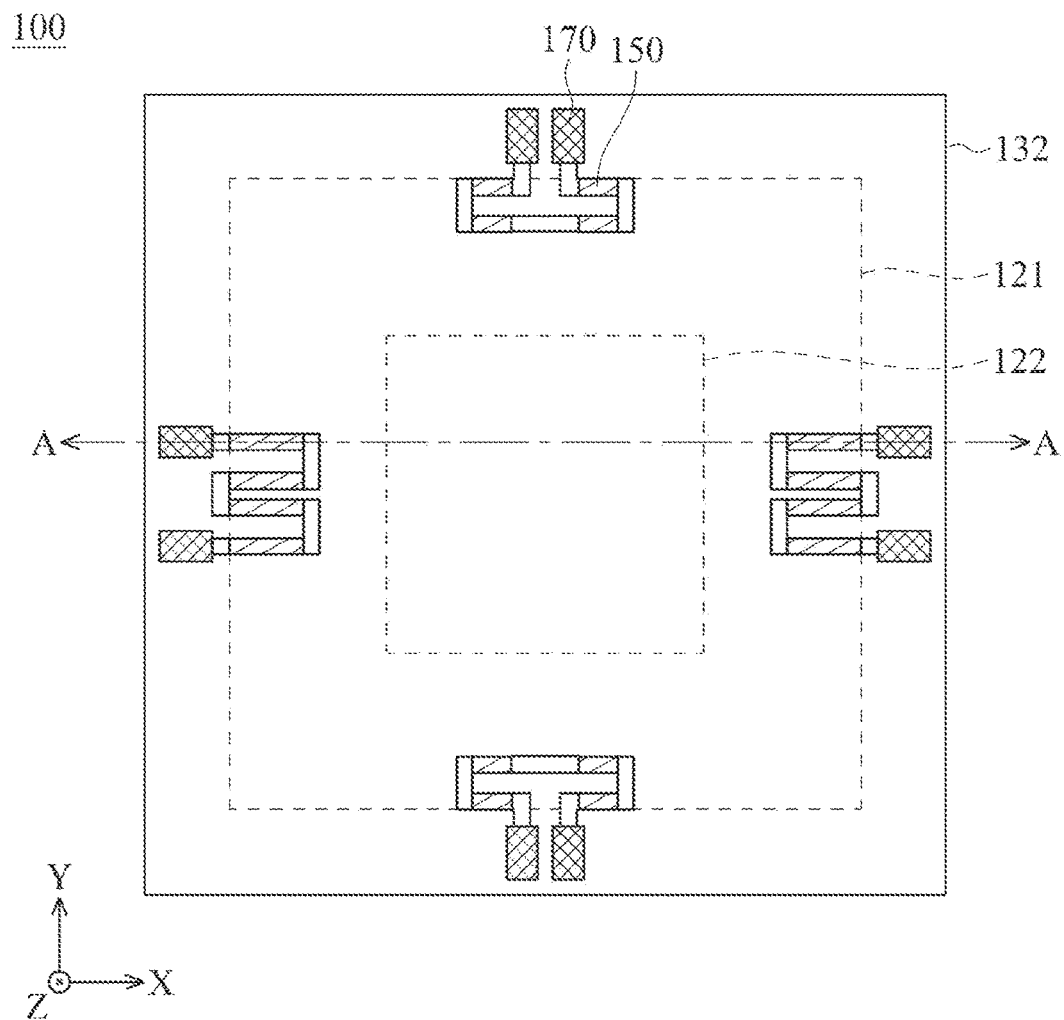
FIG. 2 is a top view illustrating the sensor membrane structure shown in FIG. 1D.

FIG. 2 is a top view illustrating the sensor membrane structure 100 shown in FIG. 1D. It should be noted that FIG. 1A to 1D are, for example, illustrated along the line A-A shown in FIG. 2. In order to show the position of the electronic component 150, the second insulating layer 133 is not illustrated. As shown in FIG. 2, the opening 122 completely falls within the region of the cavity 121. In the present embodiment, the opening 122 is located at the center of the cavity 121. In other embodiments, the opening 122 may be located at any other position of the cavity 121.

Figure 3:
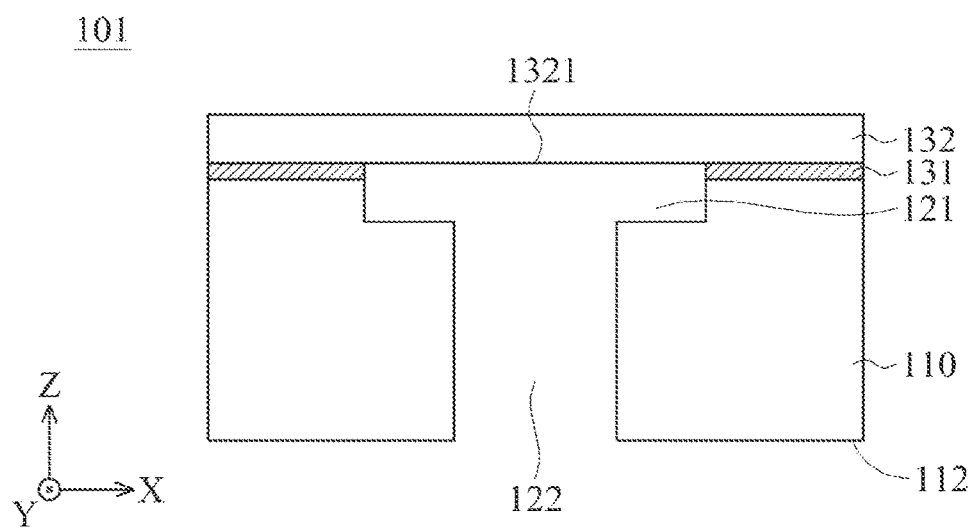
FIG. 3 is a cross-sectional view illustrating the sensor membrane structure in accordance with some embodiments of the present disclosure.

FIG. 3 is a cross-sectional view illustrating the sensor membrane structure 101 in accordance with some embodiments of the present disclosure. It should be noted that the sensor membrane structure 101 in the present embodiment may include elements that are the same as the elements (such as the electronic component 150, the second insulating layer 133, the conductive element 170, etc.) in the sensor membrane structure 100 shown in FIG. 1D, and for the sake of simplicity, these elements are not illustrated in the present embodiment. In the present embodiment, when the etching process is performed to form the opening 122, the first insulating layer 131 is further etched so that the device layer 132 has an interface 1321 (such as a portion of the lower surface of the device layer 132) that interfaces with the cavity 121. This design makes the device layer 132 be capable of react the change of pressure more sensitively, and therefore the sensing precision of the electronic component may be enhanced. Although the first insulating layer 131 located directly above the cavity 121 is completely removed in the present embodiment, those skilled in the art may partially remove the first insulating layer 131 located directly above the cavity 121 as required.

Figure 4A:
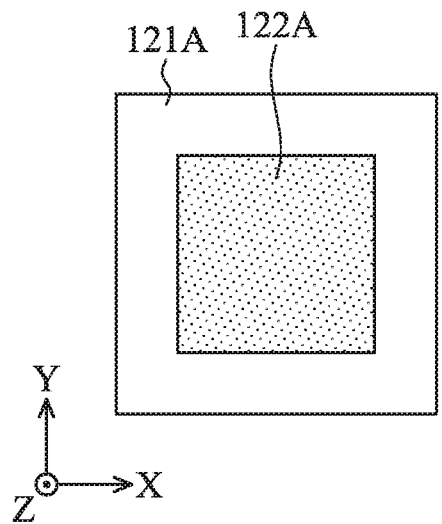
FIG. 4A to 4D are top views illustrating cavities and openings in accordance with some embodiments of the present disclosure.
Figure 4B:
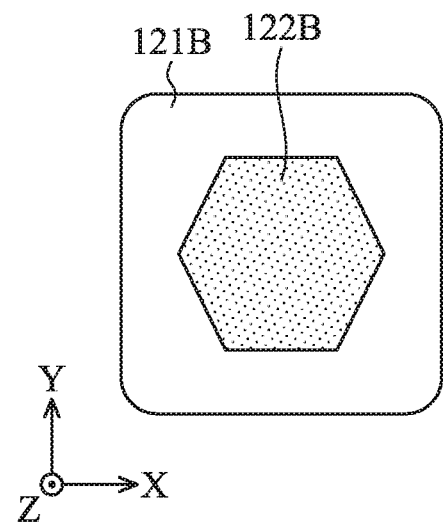
Figure 4C:
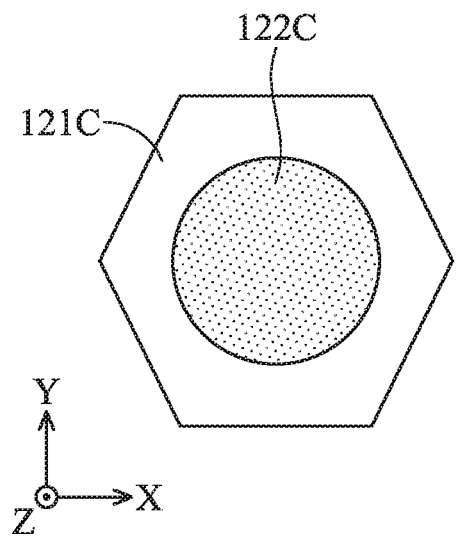
Figure 4D:
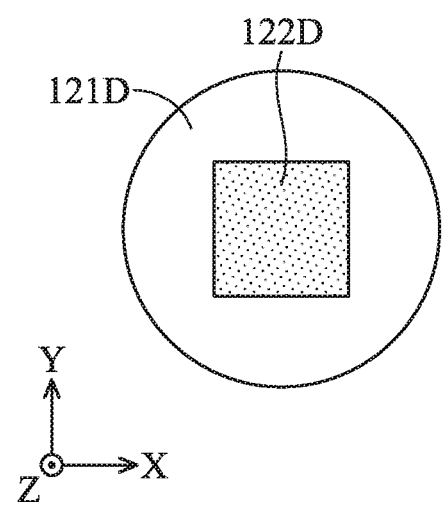

FIG. 4A to 4D are top views illustrating the cavities and the openings in accordance with some embodiments of the present disclosure. In some embodiments, the cavities and the openings may have different shapes. As shown in FIG. 4A, the cavity 121A and the opening 122A are both rectangular. As shown in FIG. 4B, the cavity 121B is a rectangle with rounded corners, and the opening 122B is polygonal (shown as a hexagon). As shown in FIG. 4C, the cavity 121C is polygonal (shown as a hexagon), and the opening 122C is circular. As shown in FIG. 4D, the cavity 121D is circular, and the opening 122D is rectangular. It should be understood that these embodiments merely serve as examples and may be combined to generate other embodiments, and these derivative embodiments will not be described in detail in following paragraphs.

Figure 5:
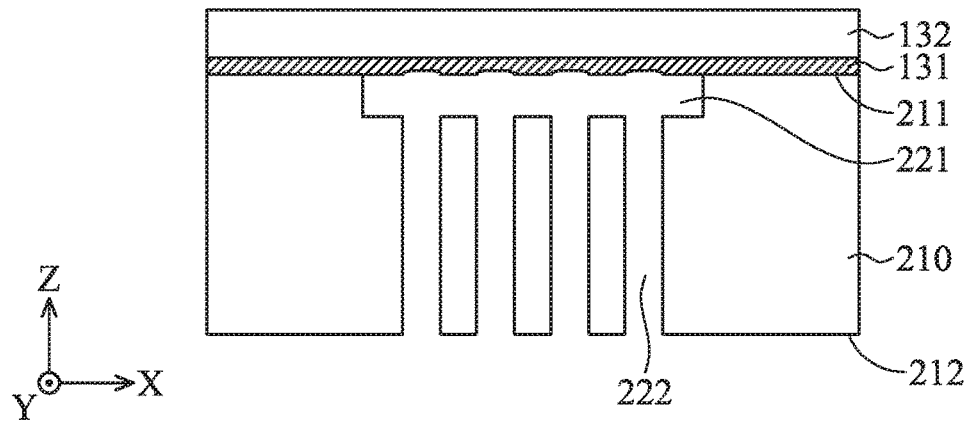
FIG. 5 is a cross-sectional view illustrating the sensor membrane structure in accordance with some embodiments of the present disclosure.

FIG. 5 is a cross-sectional view illustrating the sensor membrane structure 200 in accordance with some embodiments of the present disclosure. Similarly, the sensor membrane structure 200 may also include the second insulating layer, the electronic component, the conductive element, or any other portion although they are not illustrated in the present embodiment. As shown in FIG. 5, a plurality of openings 222 are formed on the second surface 212 of the substrate 210, and each of the openings 222 communicates with the cavity 221. In the present embodiment, the width of the cavity 221 is greater than the sum of the width of all the openings 222 in the direction that is parallel to the first surface 211.

Figure 6A:
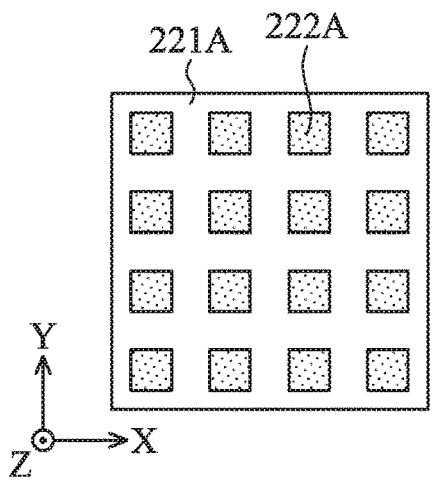
FIG. 6A to 6D are top views illustrating the cavities and the openings in accordance with some embodiments of the present disclosure.
Figure 6B:
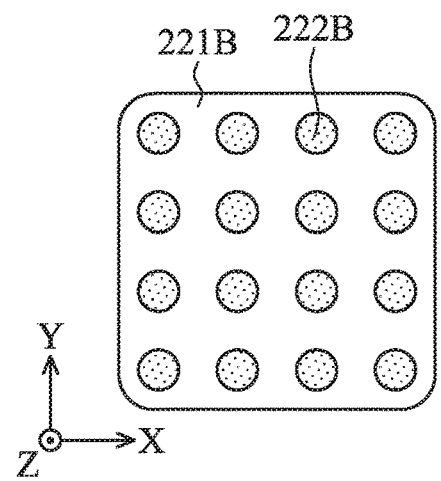
Figure 6C:
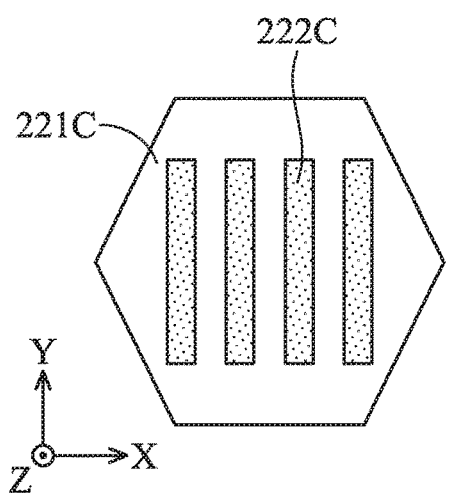
Figure 6D:
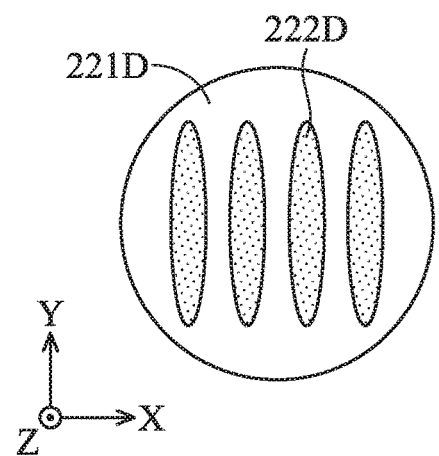

FIG. 6A to 6D are top views illustrating the cavities and the openings in accordance with some embodiments of the present disclosure. In some embodiments, the cavities and the openings may have different shapes and arrangements. As shown in FIG. 6A, the cavity 221A and the openings 222A are both rectangular, and the openings 222A are regularly arranged in the cavity 221A. As shown in FIG. 6B, the cavity 221B is a rectangle with rounded corners, and the openings 222B are circular. As shown in FIG. 6C, the cavity 221C is polygonal (shown as a hexagon), and the openings 222C have an elongated shape. As shown in FIG. 6D, the cavity 221D is circular, and the openings 222D are oval-like. It should be understood that these embodiments merely serve as examples and may be combined to generate other embodiments, and these derivative embodiments will not be described in detail in following paragraphs. In addition, although the openings are arranged regularly in the above embodiments, these openings may also be arranged irregularly.

Figure 7:
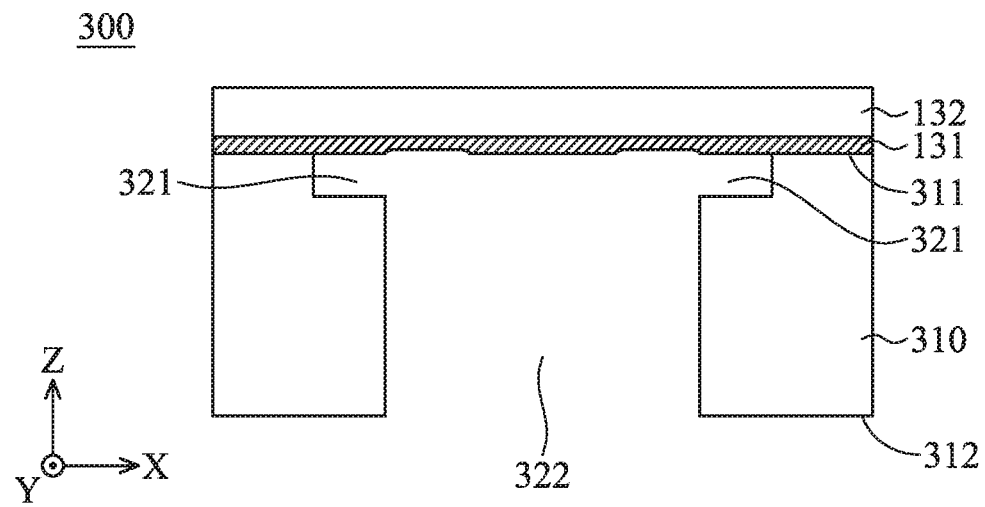
FIG. 7 is a cross-sectional view illustrating the sensor membrane structure in accordance with some embodiments of the present disclosure.

FIG. 7 is a cross-sectional view illustrating the sensor membrane structure 300 in accordance with some embodiments of the present disclosure. Similarly, the sensor membrane structure 300 may also include the second insulating layer, the electronic component, the conductive element, or any other portion although they are not illustrated in the present embodiment. As shown in FIG. 7, two separated cavities 321 are formed on the first surface 311 of the substrate 310, and the opening 322 formed on the second surface 312 communicates with the cavities 321. The original position of the cavities 321 may be determined by the position of the recesses on the first insulating layer 131. As set forth above, after the etching process for forming the opening 322 is performed, the portion of the first insulating layer 131 located directly above the cavities 321 may be thinner than the other portion of the first insulating layer 131 due to the arrangement of the cavities 321.

Figure 8A:
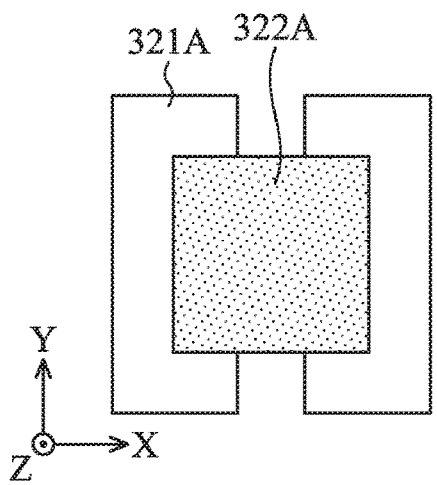
FIG. 8A to 8F are top views illustrating the cavities and the openings in accordance with some embodiments of the present disclosure.
Figure 8B:
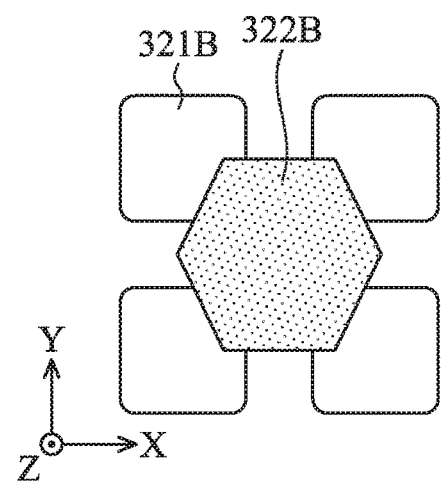
Figure 8C:
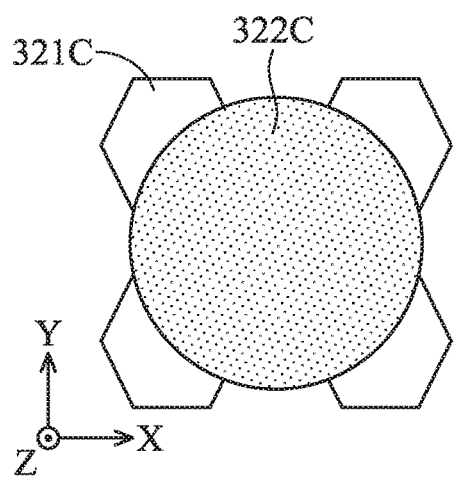
Figure 8D:
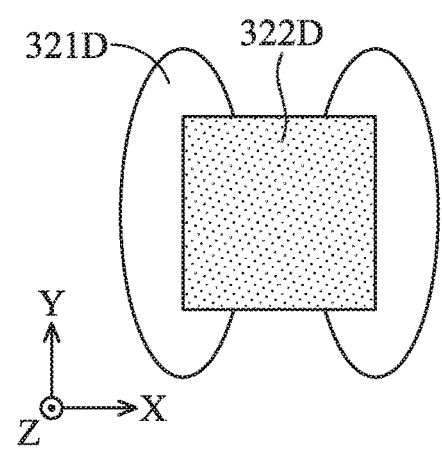
Figure 8E:
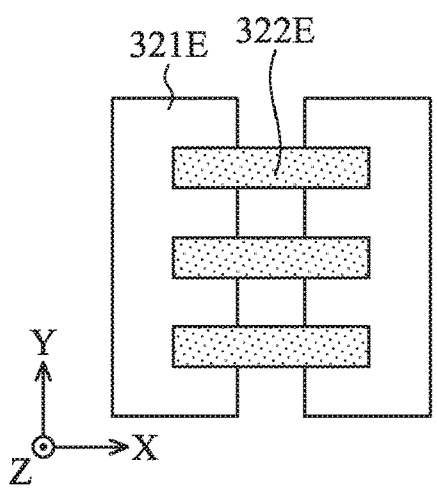
Figure 8F:
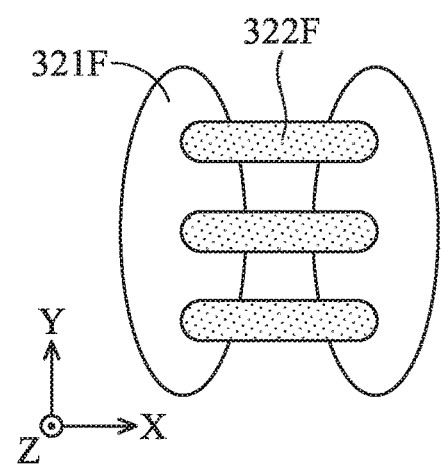

FIG. 8A to 8F are top views illustrating the cavities and the openings in accordance with some embodiments of the present disclosure. In some embodiments, the cavities and the openings may have different shapes and arrangements. In addition, the cavities and the openings do not completely overlap in these embodiments. As shown in FIG. 8A, the cavities 321A and the opening 322A are both rectangular, and the opening 322A is located between the cavities 321A. As shown in FIG. 8B, the cavities 321B are rectangles with rounded corners, and the opening 322B is polygonal (shown as a hexagon). As shown in FIG. 8C, the cavities 321C are polygonal (shown as hexagons), and the opening 322C is circular. As shown in FIG. 8D, the cavities 321D are oval, and the opening 322D is rectangular. As shown in FIG. 8E, the cavities 321E and the openings 322E are rectangular, and each of the openings 322E are connected to both of the cavities 321E. As shown in FIG. 8F, the cavities 321F are oval, and the openings 322D have an elongated shape. It should be understood that these embodiments merely serve as examples and may be combined to generate other embodiments, and these derivative embodiments will not be described in detail in following paragraphs.

FIG. 9 is a cross-sectional view illustrating the sensor membrane structure 400 in accordance with some embodiments of the present disclosure. Similarly, the sensor membrane structure 400 may also include the second insulating layer, the electronic component, the conductive element, or any other portion although they are not illustrated in the present embodiment. As shown in FIG. 9, two separated cavities 421 are formed on the first surface 411 of the substrate 410, and two openings 422 are formed on the second surface 412 and communicate with the cavities 421.

FIG. 10A to 10B are top views illustrating the cavities and the openings in accordance with some embodiments of the present disclosure. In some embodiments, the cavities and the openings may have different shapes and arrangements. In addition, the cavities and the openings do not completely overlap in these embodiments. As shown in FIG. 10A, the cavities 421A are polygonal (shown as hexagons), and the openings 422A are rectangular, wherein each of the openings 422A is connected to two of the cavities 421A. As shown in FIG. 10B, the cavities 421B are rectangles with rounded corners, and the openings 422B have an elongated shape. It should be understood that these embodiments merely serve as examples and may be combined to generate other embodiments, and these derivative embodiments will not be described in detail in following paragraphs.

As set forth above, some embodiments of the present disclosure provide a sensor membrane structure with a backside opening and a method for forming the same. A substrate with a cavity and a device with an insulating layer are combined in embodiments of the present disclosure. Since the pressure in the cavity is similar to the pressure outside of the membrane structure, when the opening is formed on the substrate during the etching, the pressures on both sides of the membrane structure remain stable. Meanwhile, an insulating layer is disposed to protect the membrane structure, so the membrane structure may be prevented from overetched and remain stable during the etching process. Therefore, the yield of the sensor membrane structure may be increased. In addition, the insulating layer may also be etched to make the device layer where the electronic component is disposed interfaces with the cavity. Accordingly, the device layer may react to the change of the pressure more sensitive, so that the sensing precision of the electronic component may be enhanced.

While the embodiments and the advantages of the present disclosure have been described above, it should be understood that those skilled in the art may make various changes, substitutions, and alterations to the present disclosure without departing from the spirit and scope of the present disclosure. It should be noted that different embodiments in the present disclosure may be arbitrarily combined as other embodiments as long as the combination conforms to the spirit of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. A sensor membrane structure, comprising:
   a substrate having a first surface and a second surface that is opposite to the first surface, wherein a cavity is formed on the first surface, an opening is formed on the second surface, the cavity communicates with the opening, and the cavity and the opening penetrate the substrate in a direction that is perpendicular to the first surface;
   a first insulating layer disposed on the first surface of the substrate, wherein the first insulating layer and the opening at least partially overlap in the direction that is perpendicular to the first surface; and
   a device layer disposed on the first insulating layer.

2. The sensor membrane structure as claimed in claim 1, wherein a width of the cavity is greater than a width of the opening in a direction that is parallel to the first surface.

3. The sensor membrane structure as claimed in claim 1, further comprising a second insulating layer disposed on the device layer, wherein a via hole is formed in the second insulating layer, and the via hole and the cavity do not overlap in the direction that is perpendicular to the first surface.

4. The sensor membrane structure as claimed in claim 3, further comprising a conductive element disposed on the second insulating layer, wherein the conductive element extends over the via hole.

5. The electronic device as claimed in claim 1, further comprising an electronic component disposed in the device layer, wherein the electronic component and the cavity at least partially overlap in the direction that is perpendicular to the first surface.

6. The sensor membrane structure as claimed in claim 1, wherein an interface is formed between the device layer and the cavity.

7. The sensor membrane structure as claimed in claim 1, wherein the device layer and the cavity are separated by the first insulating layer.

8. The sensor membrane structure as claimed in claim 1, wherein the substrate has a plurality of openings formed on the second surface, and the openings communicate with the cavity.

9. The sensor membrane structure as claimed in claim 8, wherein the width of the cavity is greater than a sum of the width of all the openings in the direction that is parallel to the first surface.

10. The sensor membrane structure as claimed in claim 1, wherein the substrate has:
    a plurality of cavities formed on the first surface; and
    a plurality of openings formed on the second surface, wherein each of the cavities communicates with at least one of the openings.

11. The sensor membrane structure as claimed in claim 1, wherein a thickness of the first insulating layer that corresponds to the opening is shorter than a thickness of the first insulating layer that does not correspond to the opening.

\* \* \* \* \*